United States Patent
Iwasawa

(10) Patent No.: US 9,536,701 B2
(45) Date of Patent: Jan. 3, 2017

(54) RADIATION ANALYZER INCLUDING A SUPPORT FOR TILTING AN ENERGY-DISPERSIVE RADIATION DETECTOR

(71) Applicant: JEOL Ltd., Tokyo (JP)

(72) Inventor: Yorinobu Iwasawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/799,856

(22) Filed: Jul. 15, 2015

(65) Prior Publication Data

US 2016/0020067 A1  Jan. 21, 2016

(30) Foreign Application Priority Data

Jul. 17, 2014 (JP) .................................. 2014-146829

(51) Int. Cl.
  G01F 23/00  (2006.01)
  H01J 37/244  (2006.01)
  H01J 37/22  (2006.01)
  H01J 37/28  (2006.01)

(52) U.S. Cl.
  CPC .............. H01J 37/244 (2013.01); H01J 37/22 (2013.01); H01J 37/28 (2013.01); *H01J 2237/10* (2013.01); *H01J 2237/2445* (2013.01)

(58) Field of Classification Search
  CPC .............. H01J 37/244; H01J 2237/2442; H01J 2237/24425; G01N 2015/0222
  USPC .......................... 250/6, 305, 307, 440.11, 306
  See application file for complete search history.

(56) References Cited

U.S. PATENT DOCUMENTS

| | | | | |
|---|---|---|---|---|
| 5,500,528 A | * | 3/1996 | Matsui | H01J 37/244 250/310 |
| 7,928,400 B1 | * | 4/2011 | Diawara | G01T 1/366 250/370.01 |
| 2003/0080293 A1 | * | 5/2003 | Dan | H01J 37/244 250/310 |
| 2006/0163478 A1 | * | 7/2006 | Jaksch | H01J 37/244 250/310 |
| 2006/0226340 A1 | * | 10/2006 | Sasayama | G01N 23/2252 250/208.1 |
| 2011/0215242 A1 | * | 9/2011 | Preikszas | H01J 37/05 250/307 |
| 2012/0132818 A1 | * | 5/2012 | Falke | H01J 37/244 250/370.01 |
| 2013/0146765 A1 | * | 6/2013 | Kitayama | H01J 37/244 250/307 |
| 2015/0144804 A1 | * | 5/2015 | Ando | H01J 37/244 250/442.11 |

FOREIGN PATENT DOCUMENTS

| | | |
|---|---|---|
| JP | 8222172 A | 8/1996 |
| JP | 9147781 A | 6/1997 |

* cited by examiner

*Primary Examiner* — Jason McCormack
(74) *Attorney, Agent, or Firm* — The Webb Law Firm

(57) ABSTRACT

A radiation analyzer includes a primary ray source that generates primary rays, an optical system applies the primary rays emitted from the primary ray source to a sample, an energy-dispersive radiation detector that detects radiation that has been generated from the sample when the primary rays have been applied to the sample, and a support that supports the radiation detector so that the tilt of the center axis (C) of the radiation detector with respect to the optical axis (Z) of the optical system can be changed.

11 Claims, 7 Drawing Sheets

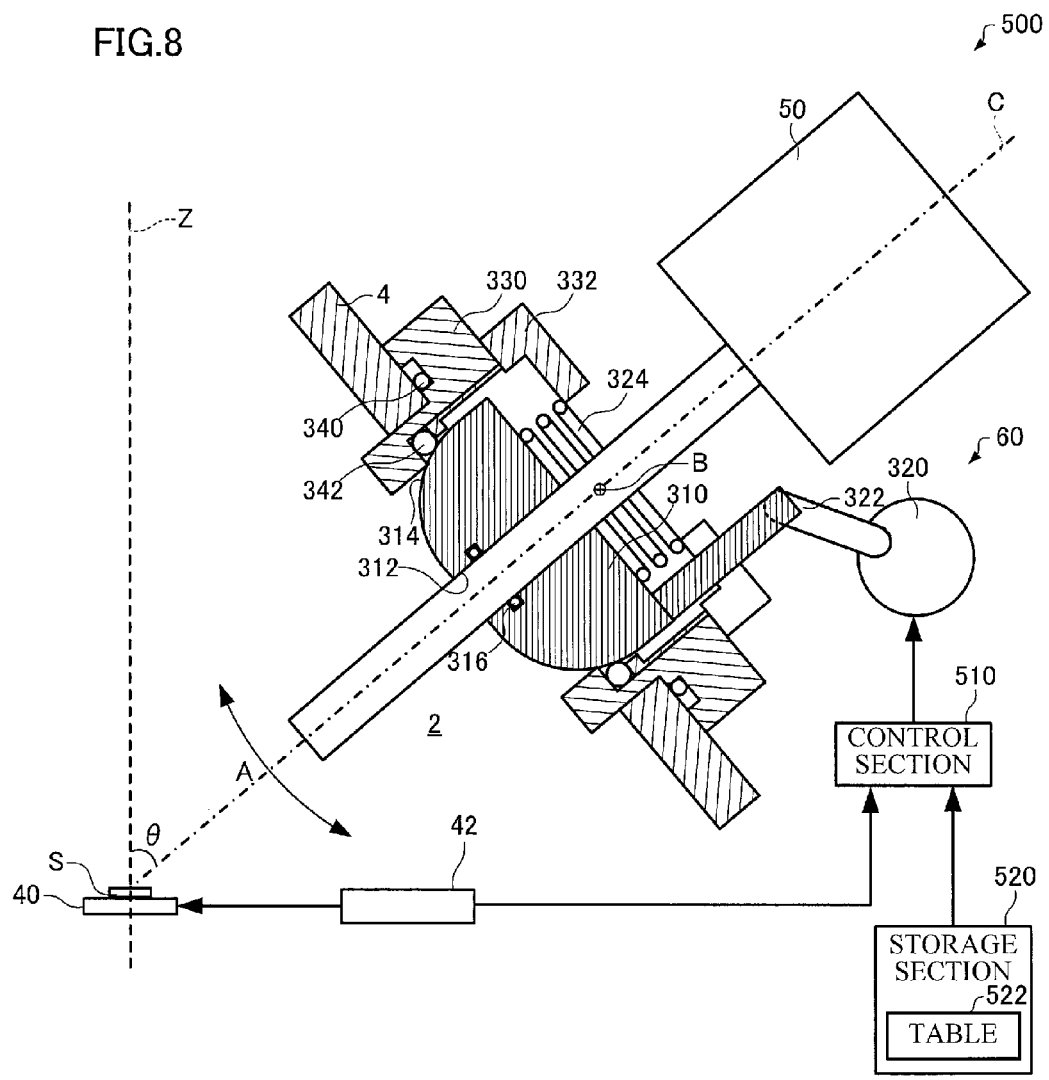

RADIATION ANALYZER INCLUDING A SUPPORT FOR TILTING AN ENERGY-DISPERSIVE RADIATION DETECTOR

Japanese Patent Application No. 2014-146829 filed on Jul. 17, 2014, is hereby incorporated by reference in its entirety.

BACKGROUND OF THE INVENTION

The present invention relates to a radiation analyzer.

An energy-dispersive X-ray detector that may be provided to a scanning electron microscope (SEM), an X-ray microanalyzer (XMA), or the like is normally secured through a flange (i.e., interface) corresponding to one working distance and one X-ray take-off angle specified by the specification.

JP-A-8-222172 and JP-A-9-147781 disclose an electron microscope that includes a plurality of energy-dispersive X-ray detectors so that two or more different X-ray take-off angles can be used.

In recent years, the working distance specified by the specification has been reduced along with an increase in resolution of a scanning electron microscope. When the working distance is short, X-rays may be interrupted (blocked) by a pole piece when detecting X-rays using the X-ray detector (i.e., it may be difficult to detect X-rays). It may be possible to prevent such a situation by reducing the X-ray take-off angle so that the X-ray detector can be used at a short working distance, for example. In this case, however, the X-ray detection accuracy may deteriorate when measuring X-rays at a long working distance.

A plurality of X-ray detectors may be provided to a scanning electron microscope so that an X-ray detector that detects X-rays at a low X-ray take-off angle is used when the working distance is short, and an X-ray detector that detects X-rays at a high X-ray take-off angle is used when the working distance is long. Specifically, X-rays may be measured using a plurality of X-ray detectors at an optimum X-ray take-off angle that corresponds to the working distance. In this case, however, an increase in cost and size of the device may occur since a plurality of X-ray detectors are necessary.

SUMMARY

The invention may provide a radiation analyzer that can efficiently detect radiation.

According to one aspect of the invention, there is provided a radiation analyzer including:

a primary ray source that generates primary rays;

an optical system that applies the primary rays emitted from the primary ray source to a sample;

an energy-dispersive radiation detector that detects radiation that has been generated from the sample when the primary rays have been applied to the sample; and a support that supports the radiation detector so that a tilt of a center axis of the radiation detector with respect to an optical axis of the optical system can be changed.

BRIEF DESCRIPTION OF THE SEVERAL VIEWS OF THE DRAWING

FIG. 8 schematically illustrates a support that is included in a radiation analyzer according to the fifth embodiment.

Figure 1:
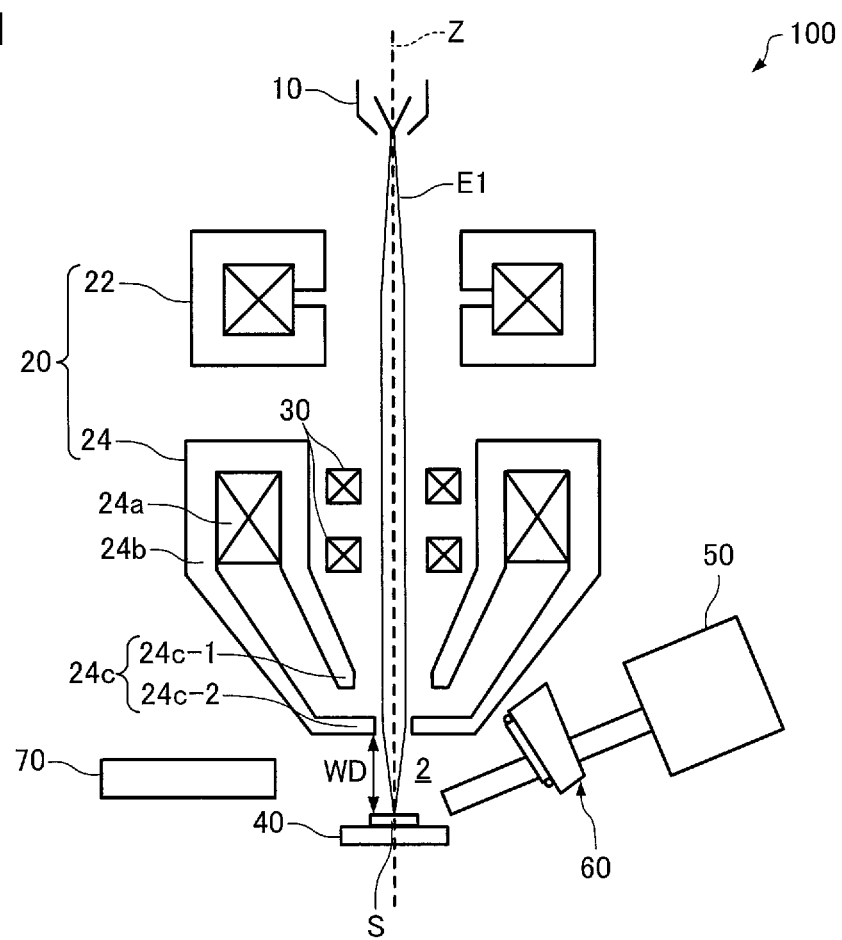
FIG. 1 schematically illustrates a radiation analyzer according to the first embodiment.

DETAILED DESCRIPTION OF THE EMBODIMENT (1) According to one embodiment of the invention, there is provided a radiation analyzer including:

a primary ray source that generates primary rays;

an optical system that applies the primary rays emitted from the primary ray source to a sample;

an energy-dispersive radiation detector that detects radiation that has been generated from the sample when the primary rays have been applied to the sample; and a support that supports the radiation detector so that a tilt of a center axis of the radiation detector with respect to an optical axis of the optical system can be changed.

The above radiation analyzer can change the take-off angle corresponding to the working distance, for example. Therefore, it is possible to suppress a situation in which radiation is interrupted (blocked) by a pole piece or the like by decreasing the take-off angle when the working distance is short. When the working distance is long, it is possible to reduce the diffusion length of radiation (released from the sample) within the sample (i.e., reduce absorption of radiation within the sample) by increasing the take-off angle. The radiation analyzer can thus efficiently detect radiation even when the working distance has changed.

Moreover, radiation can be detected using a single radiation detector at different take-off angles.

(2) The radiation analyzer may further include a sample stage that supports the sample so that the working distance can be changed.

In this case, it is possible to perform observation or analysis at an optimum working distance that corresponds to the observation magnification, for example.

(3) In the radiation analyzer, the support may include a rotation section that supports the radiation detector so as to be rotatable around a rotation axis that intersects the optical axis, and the center axis may be tilted with respect to the rotation axis.

In this case, it is possible to change the tilt of the center axis of the radiation detector with respect to the optical axis of the optical system by rotating the radiation detector using the rotation section.

(4) The radiation analyzer may further include a drive section that drives the rotation section.

In this case, it is possible to easily change the tilt of the center axis of the radiation detector with respect to the optical axis of the optical system.

(5) In the radiation analyzer, the optical system may include an objective lens, the radiation detector may be set to a second state from a first state using the support, the distance between the intersection of the optical axis and the center axis and the objective lens may be set to a first distance, and the angle formed by the optical axis and the center axis may be set to a first angle when the radiation detector is set to the first state, and the distance between the intersection of the optical axis and the center axis and the objective lens may be set to a second distance that is shorter than the first distance, and the angle formed by the optical axis and the center axis may be set to a second angle that is larger than the first angle when the radiation detector is set to the second state.

According to this configuration, when the working distance is set to the first distance, it is possible to reduce the diffusion length of radiation (released from the sample) within the sample (i.e., reduce absorption of radiation within the sample) by increasing the take-off angle as compared with the case where the working distance is set to the second distance that is shorter than the first distance, for example. When the working distance is set to the second distance, it is possible to suppress a situation in which radiation is interrupted (blocked) by a pole piece or the like by decreasing the take-off angle as compared with the case where the working distance is set to the first distance that is longer than the second distance, for example. The radiation analyzer can thus efficiently detect radiation.

(6) In the radiation analyzer, the support may include a swing section that supports the radiation detector so as to be swingable.

In this case, it is possible to change the tilt of the center axis of the radiation detector with respect to the optical axis of the optical system by swinging the radiation detector using the swing section.

(7) In the radiation analyzer, the swing axis of the swing section may be orthogonal to the center axis.

In this case, it is possible to change the tilt of the center axis of the radiation detector with respect to the optical axis of the optical system by swinging the radiation detector using the swing section.

(8) The radiation analyzer may further include a drive section that drives the swing section.

In this case, it is possible to easily change the tilt of the center axis of the radiation detector with respect to the optical axis of the optical system.

(9) In the radiation analyzer, the support may include a control section that drives the drive section based on the detection results of the radiation detector.

In this case, it is possible to position the radiation detector so that the take-off angle is set such that radiation can be efficiently detected at an arbitrary working distance, for example.

(10) In the radiation analyzer, the support may include a control section that drives the drive section based on the working distance.

In this case, it is possible to position the radiation detector so that the take-off angle is set such that radiation can be efficiently detected at an arbitrary working distance, for example.

(11) In the radiation analyzer, the support may include a storage section that stores a table that specifies the relationship between the working distance and the tilt of the center axis with respect to the optical axis, and the control section may acquire information about the tilt of the center axis with respect to the optical axis from the table corresponding to the working distance, and drive the drive section based on the information about the tilt of the center axis with respect to the optical axis.

In this case, it is possible to position the radiation detector so that the take-off angle is set such that radiation can be efficiently detected at an arbitrary working distance, for example.

(12) In the radiation analyzer, the control section may acquire information about the working distance from position information about the sample stage.

Exemplary embodiments of the invention are described in detail below with reference to the drawings. Note that the following exemplary embodiments do not unduly limit the scope of the invention as stated in the claims. Note also that all of the elements described in connection with the following exemplary embodiments should not necessarily be taken as essential elements of the invention.

1. First Embodiment

A radiation analyzer according to a first embodiment of the invention is described below with reference to the drawings. FIG. 1 schematically illustrates the radiation analyzer (radiation analyzer 100) according to the first embodiment. The first embodiment illustrates an example in which the radiation analyzer 100 is a scanning electron microscope (SEM).

As illustrated in FIG. 1, the radiation analyzer 100 includes an electron beam source (primary ray source) 10, an optical system 20, a scanning deflector 30, a sample stage 40, a radiation detector 50, a support 60, and a secondary electron detector 70. Note that a wall 4 (see FIGS. 2 and 3) (that divides a sample chamber 2 in which a sample S is disposed) is omitted in FIG. 1.

The radiation analyzer 100 is configured so that electron beams E1 generated by the electron beam source 10 are focused by the optical system 20 and used as an electron probe, and secondary electrons released from the electron probe irradiation point when the surface of the sample S is scanned with the electron probe are detected by the secondary electron detector 70 to generate an image. The radiation analyzer 100 is configured so that characteristic X-rays generated when the electron beams E1 are applied to the sample S are detected by the radiation detector 50 (energy-dispersive radiation detector), and energy-discriminated to obtain a spectrum.

The electron beam source 10 generates the electron beams E1 as primary rays. The electron beam source 10 is a known electron gun, for example. The electron beam source 10 accelerates electrons released from a cathode using an anode to emit the electron beams E1. The electron gun that may be used as the electron beam source 10 is not particularly limited. For example, a thermionic-emission electron gun, a thermal field-emission electron gun, a cold cathode field-emission electron gun, or the like may be used as the electron beam source 10. The electron beams E1 emitted from the electron beam source 10 travel forward along the optical axis Z of the optical system 20. Note that the optical axis Z of the optical system 20 refers to an axis that is situated at the center of the lenses (e.g., a focusing lens 22 and an objective lens 24 in the example illustrated in FIG. 1) included in the optical system 20.

The optical system 20 applies the electron beams E1 generated by the electron beam source 10 to the sample S. The optical system 20 includes the focusing lens 22 and the objective lens 24.

The focusing lens 22 is disposed in the subsequent stage of the electron beam source 10 (on the downstream side of the electron beam source 10 (that emits the electron beams E1)). The focusing lens 22 focuses the electron beams E1.

For example; the electron probe diameter and the probe current are controlled using the focusing lens 22.

The objective lens 24 is disposed in the subsequent stage of the focusing lens 22. The objective lens 24 is a final-stage electron probe-forming lens that is disposed in the preceding stage of the sample S. The objective lens 24 includes a coil 24a, a yoke 24b, and a pole piece 24c. The objective lens 24 is configured so that lines of magnetic force generated by the coil 24a are confined in the yoke 24b that is formed of a material (e.g., iron) that exhibits high permeability, and the lines of magnetic force that are distributed at high density leak toward the optical axis Z through a gap (lens gap) formed in the yoke 24b. The gap is formed by the pole piece 24c. The pole piece 24c includes an upper pole piece 24c-1 and a lower pole piece 24c-2. In the example illustrated in FIG. 1, the sample S is disposed outside the pole piece 24c. Specifically, the objective lens 24 is an out-lens objective lens.

The scanning deflector (scanning coil) 30 is disposed between the focusing lens 22 and the objective lens 24. The scanning deflector 30 is an electromagnetic coil that scans the sample S with the electron beams E1 that have been focused by the focusing lens 22 and the objective lens 24, for example. In the example illustrated in FIG. 1, the scanning deflector 30 is a two-stage scanning deflector (two-stage deflection system). Note that the number of stages of the scanning deflector 30 may be three or more. The scanning deflector 30 scans the sample S with the electron beams E1 by deflecting the electron beams E1. The scanning deflector 30 scans the sample S with the electron beams E1 based on a scan signal output from a scan signal generation section (not illustrated in the drawings).

The sample S is placed on the sample stage 40. The sample stage 40 supports and moves the sample S. The sample stage 40 supports the sample S so that the working distance WD can be changed. The sample stage 40 changes the working distance WD by moving the sample S along the optical axis Z of the optical system 20 (in the vertical direction). Note that the working distance WD refers to the distance between the lower side of the objective lens 24 and the sample S (i.e., the upper side of the sample S). In the example illustrated in FIG. 1, the working distance WD is the distance between the lower pole piece 24c-2 (included in the pole piece 24c) and the sample S.

The radiation analyzer 100 is configured so that the resolution increases (due to a decrease in lens aberration) and the depth of focus decreases (becomes shallow) as the working distance WD decreases. Therefore, the working distance WD is decreased when performing high-magnification observation, and is increased when performing low-magnification observation. The sample stage 40 can also horizontally move, rotate, and tilt the sample S, for example.

The radiation detector 50 is disposed between the objective lens 24 and the sample S (sample stage 40). The radiation detector 50 detects characteristic X-rays (radiation) that have been generated from the sample S when the electron beams E1 have been applied to the sample S. The radiation detector 50 is an energy-dispersive X-ray detector. The term "energy-dispersive X-ray detector" used herein refers to a device that detects characteristic X-rays or fluorescent X-rays that have been generated when primary rays (e.g., electron beams or X-rays) have been applied to a sample, and determines the elements included in the sample, the concentration of each element, and the like based on the energy and the intensity of the characteristic X-rays or the fluorescent X-rays.

The radiation detector 50 includes a silicon-drift detector (SDD), for example. The silicon-drift detector is a device that guides electrons generated due to the incident X-rays toward an anode by applying a concentric potential gradient, for example. Since the amount of charge collected into the anode is proportional to the incident X-rays, it is possible to measure the energy of the X-rays. The silicon-drift detector includes a high-purity n-type Si single crystal, a p electrode that is provided on the side of the X-ray incidence plane of the Si single crystal, an n electrode (anode) that is provided on the side opposite to the X-ray incidence plane, and multi-stage drift electrodes that surround the n electrode in a concentric manner. The drift electrodes are provided in a concentric manner around the center of the silicon-drift detector (Si single crystal) in a plan view (i.e., when viewed in the direction along the normal to the incidence plane). The silicon-drift detector does not require cooling with liquid nitrogen, and can be operated using cooling with a Peltier device. Therefore, the radiation detector 50 can be reduced in size and weight.

Figure 2:
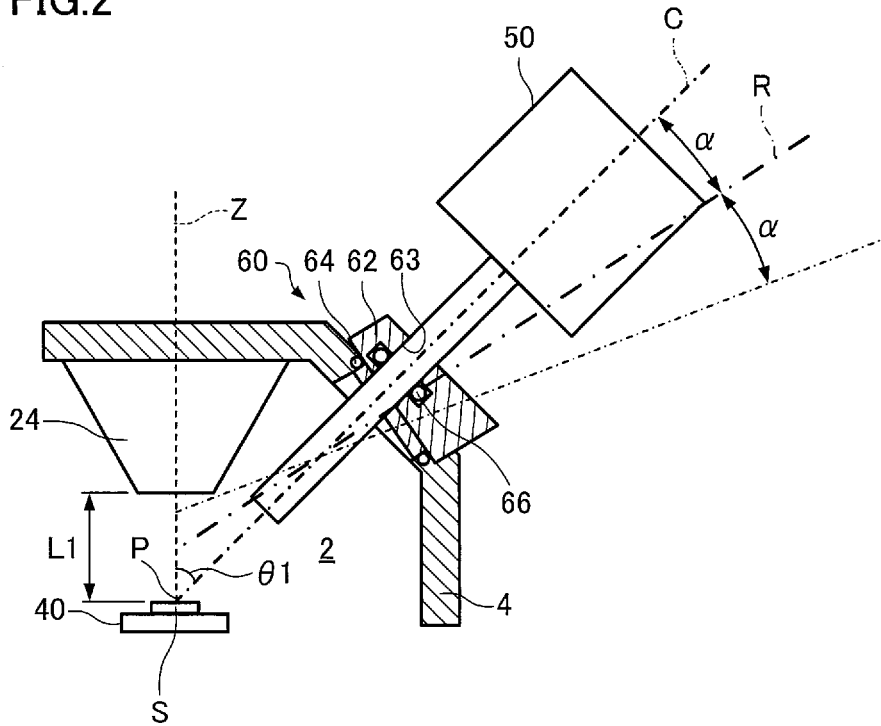
FIG. 2 illustrates an operation of a support that is included in the radiation analyzer according to the first embodiment.
Figure 3:
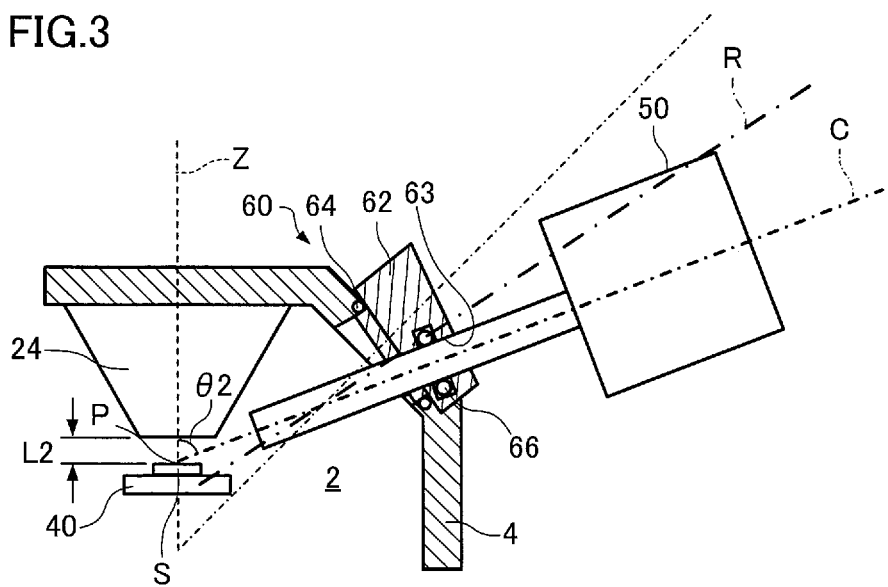
FIG. 3 illustrates an operation of a support that is included in the radiation analyzer according to the first embodiment.

The support 60 is a member that supports the radiation detector 50. FIGS. 2 and 3 illustrate the motion of the support 60. In FIGS. 2 and 3, the objective lens 24 is illustrated in a simplified manner.

As illustrated in FIGS. 2 and 3, the support 60 includes an interface flange (rotation section) 62 and an O-ring 64. The interface flange 62 is rotatably mounted on the wall 4 of the sample chamber 2 in which the sample S is placed. The interface flange 62 can rotate around a rotation axis R that passes through the center of the interface flange 62. The rotation axis R intersects the optical axis Z of the optical system 20, for example. The gap between the interface flange 62 and the wall 4 is airtightly sealed by the O-ring 64.

An insertion hole 63 (into which the radiation detector 50 is inserted) is formed in the interface flange 62. The axis (center axis) of the insertion hole 63 is tilted at an angle α with respect to the rotation axis R. Therefore, the center axis C of the radiation detector 50 that is inserted into the insertion hole 63 is tilted at the angle α with respect to the rotation axis R. The gap between the interface flange 62 and the radiation detector 50 (that is inserted into the insertion hole 63) is airtightly sealed by an O-ring 66.

The center axis C of the radiation detector 50 refers to an axis that passes through the center of the detection plane of the radiation detector 50, and is orthogonal to the detection plane, for example. The detection plane of the radiation detector 50 corresponds to the X-ray incidence plane of the silicon-drift detector, and the center of the detection plane corresponds to the center of the silicon-drift detector (in a plan view), for example. Therefore, the detection plane of the radiation detector 50 (i.e., the incidence plane of the silicon-drift detector) can be trained on the irradiation area of the sample S (where the electron beams E1 are applied, and characteristic X-rays are generated when the electron beams E1 have been applied) by adjusting the intersection P of the optical axis Z of the optical system 20 and the center axis C of the radiation detector 50 to be situated on the surface of the sample S. In the example illustrated in FIGS. 2 and 3, the center axis C of the radiation detector 50 intersects the optical axis Z of the optical system 20. Note that the center axis C of the radiation detector 50 may be skewed with respect to the optical axis Z of the optical system 20.

The interface flange 62 supports the radiation detector 50 so as to be rotatable around the rotation axis R. For example, the user can manually rotate the interface flange 62. Since the center axis C of the radiation detector 50 is tilted with respect to the rotation axis R (see above), the tilt of the center axis C of the radiation detector 50 with respect to the optical axis Z of the optical system 20 can be changed (see FIGS. 2 and 3) by rotating the interface flange 62. The X-ray take-off angle can be changed by changing the tilt of the center axis C of the radiation detector 50 with respect to the optical axis Z of the optical system 20.

Note that the term "take-off angle" used herein refers to an angle at which characteristic X-rays released from the sample are detected by the radiation detector that is situated above the sample. More specifically, the term "take-off angle" used herein refers to the angle formed by the surface of the sample and the detector (i.e., the center axis of the detector).

The radiation detector 50 is set to a second state illustrated in FIG. 3 from a first state illustrated in FIG. 2 by rotating the interface flange 62 (by 180° in the example illustrated in FIGS. 2 and 3). Likewise, the radiation detector 50 is set to the first state illustrated in FIG. 2 from the second state illustrated in FIG. 3 by rotating the interface flange 62 (by 180° in the example illustrated in FIGS. 2 and 3).

When the radiation detector 50 is set to the first state, the distance between the intersection P (of the optical axis Z of the optical system 20 and the center axis C of the radiation detector 50) and the objective lens 24 is set to a first distance L1, and the angle $\theta$ formed by the optical axis Z of the optical system 20 and the center axis C of the radiation detector 50 is set to a first angle $\theta 1$ (see FIG. 2).

When the radiation detector 50 is set to the second state, the distance between the intersection P (of the optical axis Z of the optical system 20 and the center axis C of the radiation detector 50) and the objective lens 24 is set to a second distance L2 that is shorter than the first distance L1, and the angle $\theta$ formed by the optical axis Z of the optical system 20 and the center axis C of the radiation detector 50 is set to a second angle $\theta 2$ that is larger than the first angle $\theta 1$ (see FIG. 3).

Note that the angle $\theta$ formed by the optical axis Z of the optical system 20 and the center axis C of the radiation detector 50 refers to the acute angle formed by the optical axis Z and the center axis C. When the intersection P of the optical axis Z of the optical system 20 and the center axis C of the radiation detector 50 is situated on the surface of the sample S, the angle $\theta$ formed by the optical axis Z of the optical system 20 and the center axis C of the radiation detector 50 is calculated by $\theta=90°-$[take-off angle]. The X-ray take-off angle can be changed by changing the angle $\theta$ formed by the center axis C of the radiation detector 50 and the optical axis Z of the optical system 20.

The secondary electron detector 70 detects secondary electrons that have been released from the sample S when the electron beams E1 have been applied to the sample S. The secondary electron detector 70 includes a scintillator and a photomultiplier, for example. A secondary electron detection signal (intensity signal) detected by the secondary electron detector 70 is stored in a storage section (not illustrated in the drawings) as image data that is synchronized with the scan signal (electron beam (E1) scan signal). A scanning electron image of the sample S is generated based on the image data. In the example illustrated in FIG. 1, the secondary electron detector 70 is disposed between the objective lens 24 and the sample S (sample stage 40).

The operation of the radiation analyzer 100 is described below.

The radiation analyzer 100 increases the working distance WD during low-magnification observation (see FIG. 2). In the example illustrated in FIG. 2, the working distance WD is set to the first distance L1 during low-magnification observation. The radiation analyzer 100 increases the working distance WD by moving the sample S away from the objective lens 24 using the sample stage 40.

In this case, the radiation detector 50 is set to the first state using the support 60. For example, the user sets the radiation detector 50 to the first state by rotating the interface flange 62. The intersection P of the optical axis Z of the optical system 20 and the center axis C of the radiation detector 50 is thus situated on the surface of the sample S. Therefore, the radiation analyzer 100 can efficiently detect characteristic X-rays generated from the sample S when performing X-ray analysis during low-magnification observation in which the working distance WD is increased.

The radiation analyzer 100 decreases the working distance WD during high-magnification observation (see FIG. 3). In the example illustrated in FIG. 3, the working distance WD is set to the second distance L2 (that is shorter than the first distance L1) during high-magnification observation. The radiation analyzer 100 decreases the working distance WD by moving the sample S closer to the objective lens 24 using the sample stage 40.

In this case, the radiation detector 50 is set to the second state using the support 60. For example, the user sets the radiation detector 50 to the second state by rotating the interface flange 62 of the support 60 by 180° from the state illustrated in FIG. 2. The intersection P of the optical axis Z of the optical system 20 and the center axis C of the radiation detector 50 is thus situated on the surface of the sample S. The angle formed by the optical axis Z of the optical system 20 and the center axis C of the radiation detector 50 when the radiation detector 50 is set to the second state is larger than that when the radiation detector 50 is set to the first state. Specifically, the X-ray take-off angle when the radiation detector 50 is set to the second state is smaller than that when the radiation detector 50 is set to the first state. This makes it possible to suppress a situation in which characteristic X-rays are interrupted (blocked) by the pole piece 24c. Therefore, the radiation analyzer 100 can efficiently detect characteristic X-rays generated from the sample S when performing X-ray analysis during high-magnification observation in which the working distance WD is decreased.

Specifically, the radiation analyzer 100 is configured so that the radiation detector 50 can detect characteristic X-rays at a high take-off angle when the working distance WD is long, and can detect characteristic X-rays at a low take-off angle when the working distance WD is short. Therefore, the radiation analyzer 100 can efficiently detect characteristic X-rays generated from the sample S even when the working distance WD has changed.

The radiation analyzer 100 has the following features, for example.

The radiation analyzer 100 is configured so that the support 60 supports the radiation detector 50 so that the tilt of the center axis C of the radiation detector 50 with respect to the optical axis Z of the optical system 20 can be changed. Therefore, the radiation analyzer 100 can change the take-off angle corresponding to the working distance WD. Therefore, it is possible to suppress a situation in which characteristic X-rays are interrupted (blocked) by the pole piece 24c by decreasing the take-off angle when the working distance WD is short, for example. When the working distance WD is long, it is possible to reduce the diffusion length of X-rays (released from the sample S) within the sample S (i.e., reduce absorption of X-rays within the sample S) by increasing the take-off angle, for example. Specifically, the radiation analyzer 100 can perform X-ray analysis during high-magnification observation (in which the working distance WD is decreased) and X-ray analysis during low-magnification observation (in which the working distance WD is increased) using an optimum X-ray take-off angle.

Since the radiation analyzer 100 is configured so that the support 60 supports the radiation detector 50 so that the tilt of the center axis C of the radiation detector 50 with respect to the optical axis Z of the optical system 20 can be changed, the radiation analyzer 100 can efficiently detect X-rays even when the working distance WD has changed.

Since the radiation analyzer 100 is configured so that the support 60 supports the radiation detector 50 so that the tilt of the center axis C of the radiation detector 50 with respect to the optical axis Z of the optical system 20 can be changed, X-rays can be detected using a single radiation detector 50 at different take-off angles. Therefore, the size and the cost of the radiation analyzer 100 can be reduced as compared with the case of measuring X-rays using a plurality of radiation detectors at an optimum X-ray take-off angle that corresponds to the working distance WD, for example.

Since the radiation analyzer 100 is configured so that the working distance WD can be changed using the sample stage 40, it is possible to perform observation or analysis at an optimum working distance WD that corresponds to the observation magnification.

The radiation analyzer 100 is configured so that the support 60 includes the interface flange (rotation section) 62 that supports the radiation detector 50 so as to be rotatable around the rotation axis R that intersects the optical axis Z of the optical system 20, and the center axis C of the radiation detector 50 is tilted with respect to the rotation axis R. Therefore, it is possible to change the tilt of the center axis C of the radiation detector 50 with respect to the optical axis Z of the optical system 20 by rotating the radiation detector 50 using the interface flange 62.

The radiation analyzer 100 is configured so that the radiation detector 50 is set to the second state from the first state using the support 60, the distance between the intersection P (of the optical axis Z of the optical system 20 and the center axis C of the radiation detector 50) and the objective lens 24 is set to the first distance L1, and the angle θ formed by the optical axis Z of the optical system 20 and the center axis C of the radiation detector 50 is set to the first angle θ1 when the radiation detector 50 is set to the first state, and the distance between the intersection P (of the optical axis Z of the optical system 20 and the center axis C of the radiation detector 50) and the objective lens 24 is set to the second distance L2 that is shorter than the first distance L1, and the angle θ formed by the optical axis Z of the optical, system 20 and the center axis C of the radiation detector 50 is set to the second angle θ2 that is larger than the first angle θ1 when the radiation detector 50 is set to the second state. Therefore, when the working distance WD is set to the first distance L1, it is possible to reduce the diffusion length of X-rays (released from, the sample S) within the sample S (i.e., reduce absorption of X-rays within the sample S) by increasing the take-off angle as compared with the case where the working distance WD is set to the second distance L2 that is shorter than the first distance L1, for example. When the working distance WD is set to the second distance L2, it is possible to suppress a situation in which X-rays are interrupted (blocked) by the pole piece 24c or the like by decreasing the take-off angle as compared with the case where the working distance WD is set to the first distance L1 that is longer than the second distance L2, for example. The radiation analyzer 100 can thus efficiently detect radiation.

2. Second Embodiment

Figure 4:
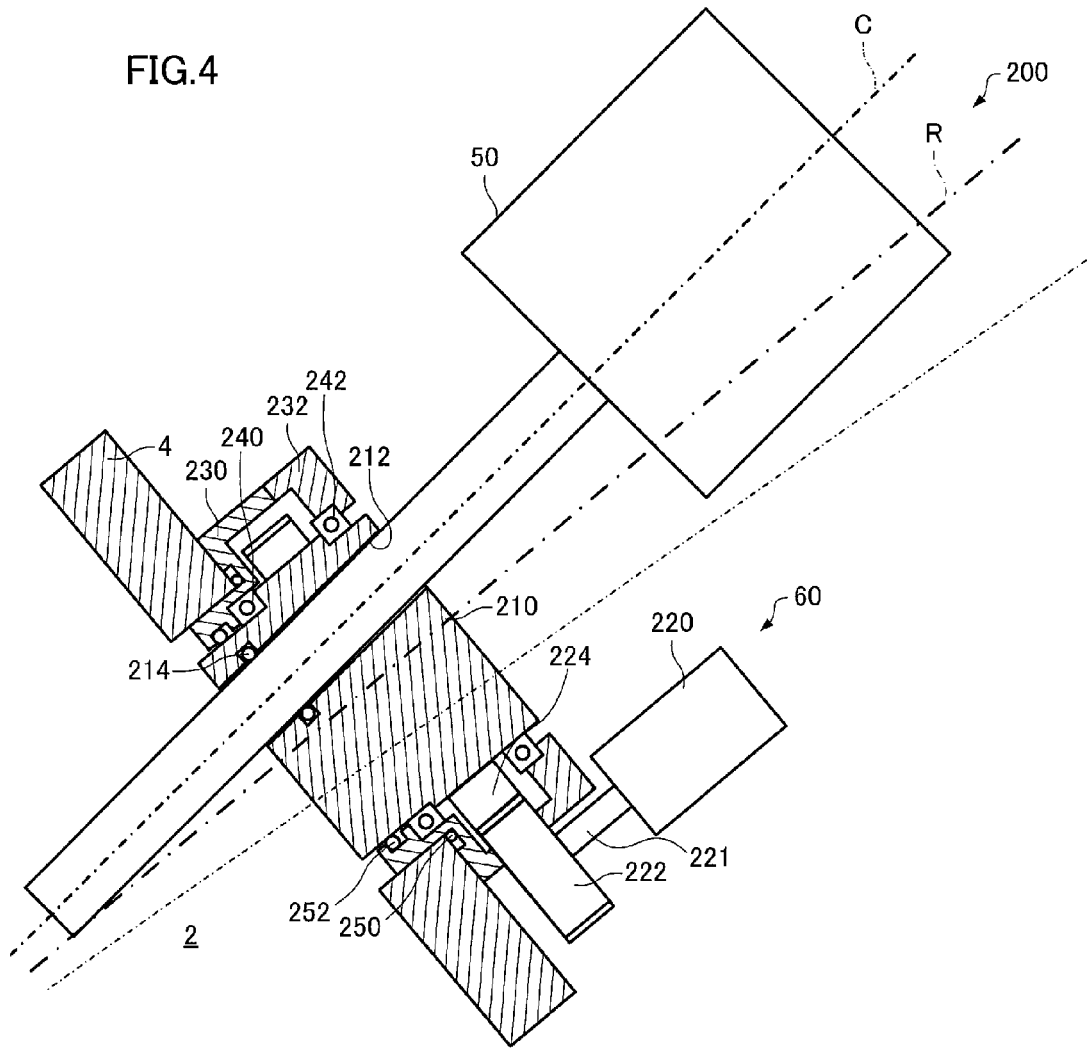
FIG. 4 schematically illustrates a support that is included in a radiation analyzer according to the second embodiment.
Figure 5:
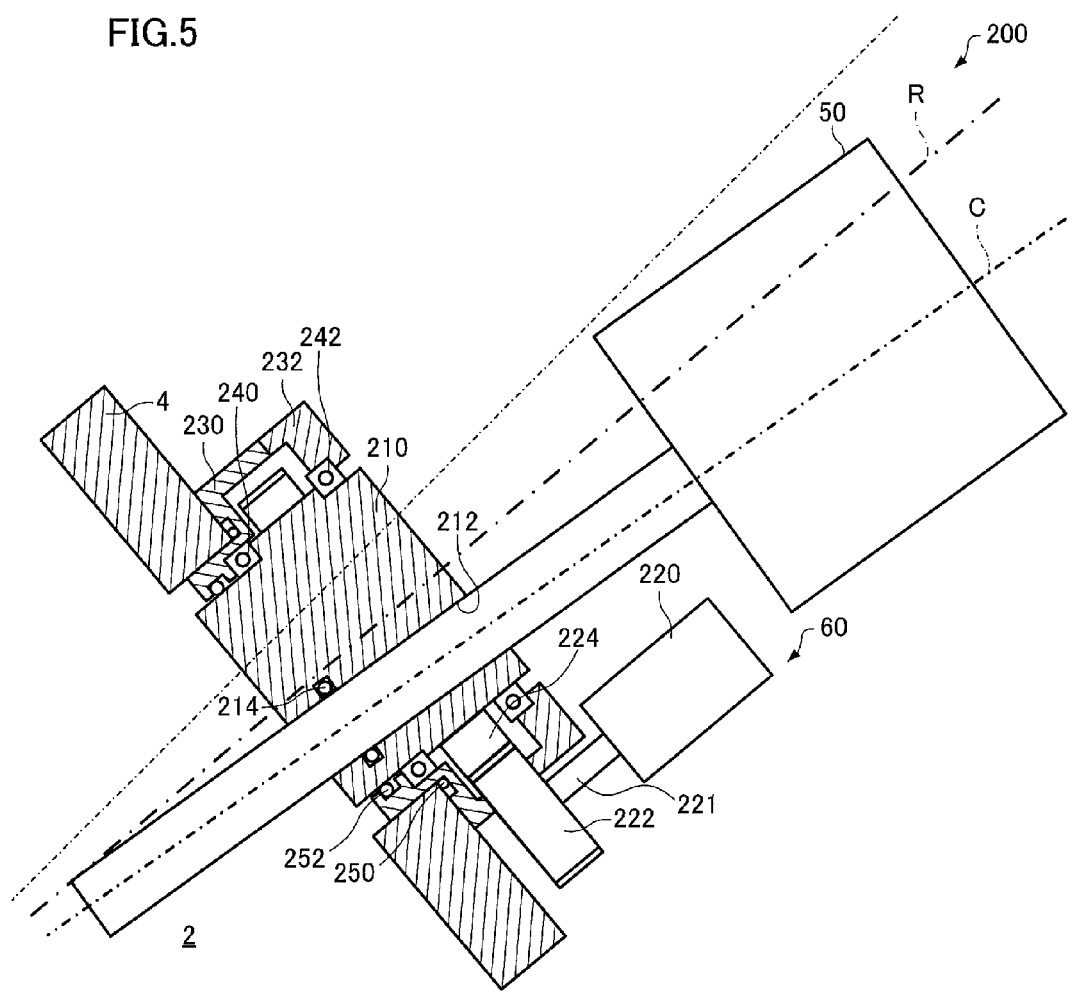
FIG. 5 schematically illustrates a support that is included in the radiation analyzer according to the second embodiment.

A radiation analyzer according to a second embodiment of the invention is described below with reference to FIGS. 4 and 5. FIGS. 4 and 5 schematically illustrate a support 60 that is included in a radiation analyzer 200 according to the second embodiment. Note that FIG. 4 illustrates a state in which a radiation detector 50 is set to a first state, and FIG. 5 illustrates a state in which the radiation detector 50 is set to a second state.

The following description focuses on the differences between the radiation analyzer 200 according to the second embodiment and the radiation analyzer 100 according to the first embodiment, and detailed description of the same features is omitted.

As illustrated in FIGS. 4 and 5, the radiation analyzer 200 is configured so that the support 60 includes a rotation section 210 that supports the radiation detector 50 so as to be rotatable around the rotation axis R, and a drive section 220 that drives the rotation section 210.

The support 60 further includes a first gear 222, a second gear 224, a first securing section 230, and a second securing section 232.

The support 60 is mounted on the wall 4 through the first securing section 230 (interface). The gap between the first securing section 230 and the wall 4 is airtightly sealed by an O-ring 250. The first securing section 230 holds the rotation section 210 through a bearing 240 so that the rotation section 210 can be rotated. The gap between the first securing section 230 and the rotation section 210 is airtightly sealed by an O-ring 252. The second securing section 232 holds the rotation section 210 through a bearing 242 in order to prevent removal of the rotation section 210.

An insertion hole 212 (into which the radiation detector 50 is inserted) is formed in the rotation section 210. The axis (center axis) of the insertion hole 212 is tilted with respect to the rotation axis R. Therefore, the center axis C of the radiation detector 50 that is inserted into the insertion hole 212 is tilted with respect to the rotation axis R. The gap between the rotation section 210 and the radiation detector 50 (that is inserted into the insertion hole 212) is airtightly sealed by an O-ring 214.

The drive section 220 includes a motor, for example. The first gear 222 is secured on a shaft (motor shaft) 221 of the drive section 220, and transmits rotation of the drive section 220 to the second gear 224. The second gear 224 is provided around the rotation section 210. When the drive section 220 has rotated the shaft 221, the rotation of the drive section 220 is transmitted to the rotation section 210 through the first gear 222 and the second gear 224.

The radiation analyzer 200 is configured so that the radiation detector 50 can be set to the second state illustrated in FIG. 5 from the first state illustrated in FIG. 4, or set to the first state illustrated in FIG. 4 from the second state illustrated in FIG. 5 by rotating the rotation section 210 using the drive section 220.

The radiation analyzer 200 has the following features, for example. The radiation analyzer 200 includes the drive section 220 that drives the rotation section 210. Therefore, the radiation analyzer 200 can easily change the tilt of the center axis C of the radiation detector 50 with respect to the optical axis Z of the optical system 20.

Since the radiation analyzer 200 includes the drive section 220 that drives the rotation section 210, it is possible to change the tilt of the center axis C of the radiation detector 50 with respect to the optical axis Z of the optical system 20 while maintaining the sample chamber 2 under reduced pressure without exposing the sample chamber 2 to the atmosphere, for example. When the user manually rotates the rotation section 210, an unexpected force may be applied to the rotation section 210, and gas may leak through the gap between the rotation section 210 and the first securing section 230, whereby the degree of vacuum inside the sample chamber 2 may decrease, for example. Since the radiation analyzer 200 rotates the rotation section 210 using the drive section 220, it is possible to reduce the possibility that gas leaks through the gap between the rotation section 210 and the first securing section 230, and the degree of vacuum inside the sample chamber 2 decreases, for example, as compared with the case of manually rotating the rotation section 210.

3. Third Embodiment

Figure 6:
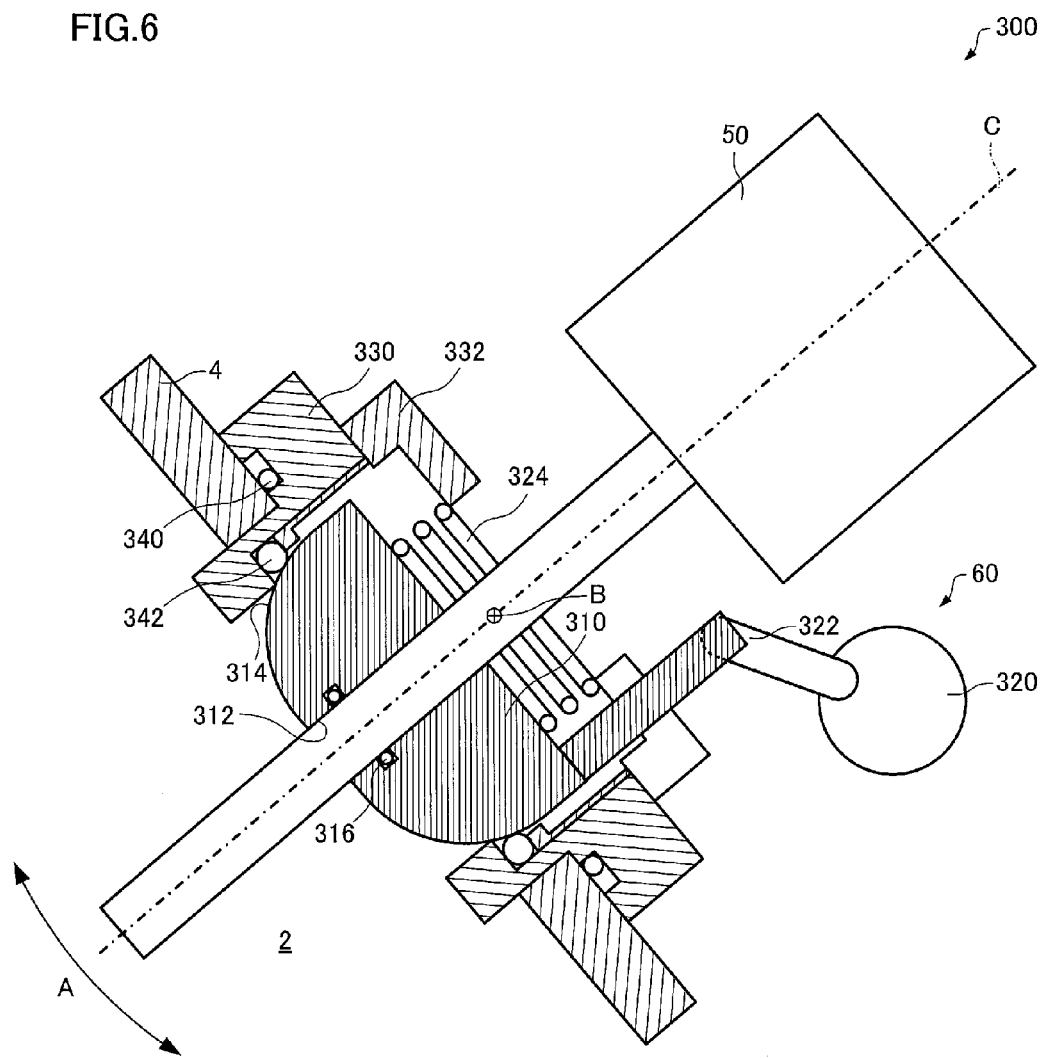
FIG. 6 schematically illustrates a support that is included in a radiation analyzer according to the third embodiment.

A radiation analyzer according to a third embodiment of the invention is described below with reference to FIG. 6. FIG. 6 schematically illustrates a support 60 that is included in a radiation analyzer 300 according to the third embodiment. The following description focuses on the differences between the radiation analyzer 300 according to the third embodiment and the radiation analyzer 100 according to the first embodiment, and detailed description of the same features is omitted.

As illustrated in FIG. 6, the radiation analyzer 300 is configured so that the support 60 includes a swing section 310 that supports the radiation detector 50 so as to be swingable, and a drive section 320 that drives the swing section 310.

The support 60 further includes an arm 322, a spring 324, a first securing section 330, and a second securing section 332.

The support 60 is mounted on the wall 4 through the first securing section 330 (interface). The gap between the first securing section 330 and the wall 4 is airtightly sealed by an O-ring 340.

An insertion hole 312 (into which the radiation detector 50 is inserted) is formed in the swing section 310. The swing section 310 has a swing axis B that is orthogonal to the center axis C of the radiation detector 50 (that is inserted into the insertion hole 312), for example. In the example illustrated in FIG. 6, the swing axis B of the swing section 310 is orthogonal to the center axis C of the radiation detector 50, and is also orthogonal to the sheet. The radiation detector 50 can be swung in the direction indicated by the arrow A illustrated in FIG. 6 by causing the swing section 310 to make a swing motion. The tilt of the center axis C of the radiation detector 50 with respect to the optical axis Z of the optical system 20, and the position of the intersection P of the optical axis Z of the optical system 20 and the center axis C of the radiation detector 50 (see FIGS. 1 to 3) can be changed by swinging the radiation detector 50. The gap between the swing section 310 and the radiation detector 50 (that is inserted into the insertion hole 312) is airtightly sealed by an O-ring 316.

The gap between the swing section 310 and the first securing section 330 is airtightly sealed by an O-ring 342. A vacuum seal surface (i.e., the surface that comes in contact with the O-ring 342) 314 of the swing section 310 is curved (e.g., spherical). Therefore, a situation in which gas leaks through the gap between the swing section 310 and the first securing section 330 does not occur even when the swing section 310 makes a swing motion. A change in posture of the swing section 310 that occurs when the swing section 310 makes a swing motion is absorbed by the spring 324. The spring 324 is held by the second securing section 332.

The drive section 320 includes a motor, for example. It is possible to cause the swing section 310 to make a swing motion using the principle of leverage by rotating the arm 322 using the drive section 320. The drive section 320 can stop the swing section 310 at the desired position.

The radiation analyzer 300 has the following features, for example.

The radiation analyzer 300 is configured so that the support 60 includes the swing section 310 that supports the radiation detector 50 so as to be swingable. Therefore, the radiation analyzer 300 can change the tilt of the center axis C of the radiation detector 50 with respect to the optical axis Z of the optical system 20 by swinging the radiation detector 50 using the swing section 310. Accordingly, the radiation analyzer 300 can efficiently detect X-rays even when the working distance WD has changed in the same manner as the radiation analyzer 100 according to the first embodiment.

The radiation analyzer 300 is configured so that the center axis C of the radiation detector 50 necessarily intersects the optical axis Z of the optical system 20 even when the radiation detector 50 is swung using the swing section 310. For example, the radiation analyzer 100 illustrated in FIGS. 2 and 3 iS configured so that the center axis C of the radiation detector 50 intersects the optical axis Z of the optical system 20 only when the radiation detector 50 is set to the first state or the second state. Therefore, the radiation analyzer 300 can deal with a wider range of working distances WD as compared with the radiation analyzer 100, for example.

The radiation analyzer 300 includes the drive section 320 that drives the swing section 310. Therefore, the radiation analyzer 300 can easily change the tilt of the center axis C of the radiation detector 50 with respect to the optical axis Z of the optical system 20.

Since the radiation analyzer 300 includes the drive section 320 that drives the swing section 310, it is possible to change the tilt of the center axis C of the radiation detector 50 with respect to the optical axis Z of the optical system 20 while maintaining the sample chamber 2 under reduced pressure without exposing the sample chamber 2 to the atmosphere, for example. When the user manually causes the swing section 310 to make a swing motion, an unexpected force may be applied to the swing section 310, and gas may leak through the gap between the swing section 310 and the first securing section 330, whereby the degree of vacuum inside the sample chamber 2 may decrease, for example. Since the radiation analyzer 300 causes the swing section 310 to make a swing motion using the drive section 320, it is possible to reduce the possibility that gas leaks through the gap between the swing section 310 and the first securing section 330, and the degree of vacuum inside the sample chamber 2 decreases, for example, as compared with the case of manually causing the swing section 310 to make a swing motion.

4. Fourth Embodiment

Figure 7:
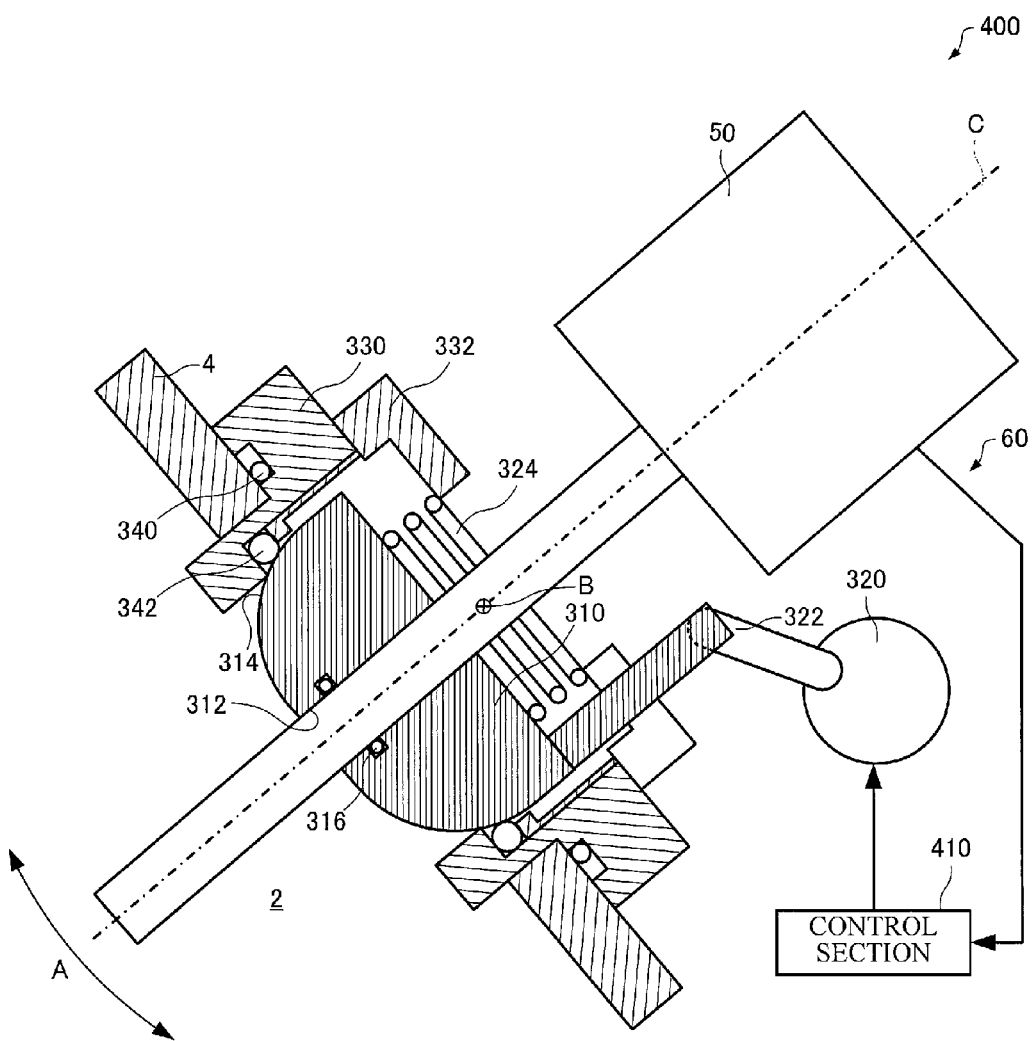
FIG. 7 schematically illustrates a support that is included in a radiation analyzer according to the fourth embodiment.

A radiation analyzer according to a fourth embodiment of the invention is described below with reference to FIG. 7. FIG. 7 schematically illustrates a support 60 that is included in a radiation analyzer 400 according to the fourth embodiment. The following description focuses on the differences between the radiation analyzer 400 according to the fourth embodiment and the radiation analyzer 300 according to the third embodiment, and detailed description of the same features is omitted.

As illustrated in FIG. 7, the radiation analyzer 400 according to the fourth embodiment is configured so that the support 60 includes a control section 410 that drives the drive section 320 based on the detection results of the radiation detector 50.

For example, when the electron beams E1 are being applied to the sample S, the control section 410 receives the information about the intensity of X-rays output from the radiation detector 50, and determines the tilt of the center axis C at which the intensity of X-rays becomes a maximum while changing the tilt of the center axis C of the radiation detector 50 with respect to the optical axis Z of the optical system 20 within a predetermined range by driving the drive section 320. The control section 410 stores the tilt of the center axis C at which the intensity of X-rays becomes a maximum, and moves the radiation detector 50 by driving the drive section 320 so that the center axis C of the radiation detector 50 is tilted such that the intensity of X-rays becomes a maximum.

Although an example has been described above in which the control section 410 moves the radiation detector 50 so that the center axis C of the radiation detector 50 is tilted such that the intensity of X-rays becomes a maximum, the control section 410 may move the radiation detector 50 so that the center axis C of the radiation detector 50 is tilted such that the intensity of X-rays exceeds a predetermined value, for example. In this case, the operation is the same as described above.

Since the radiation analyzer 400 includes the control section 410 that drives the drive section 320 based on the detection results of the radiation detector 50, it is possible to position the radiation detector 50 so that the take-off angle is set such that X-rays can be efficiently detected at an arbitrary working distance WD. For example, the radiation analyzer 400 has an advantage in that the control section 410 can automatically position the radiation detector 50 so that the X-ray take-off angle is set to be optimum for the working distance WD even when the working distance WD has changed.

5. Fifth Embodiment

A radiation analyzer according to a fifth embodiment of the invention is described below with reference to FIG. 8. FIG. 8 schematically illustrates a support 60 that is included in a radiation analyzer 500 according to the fifth embodiment. The following description focuses on the differences between the radiation analyzer 500 according to, the fifth embodiment and the radiation analyzer 300 according to the third embodiment, and detailed description of the same features is omitted.

As illustrated in FIG. 8, the radiation analyzer 500 according to the fifth embodiment is configured so that the support 60 includes a control section 510 and a storage section 520.

The control section 510 drives the drive section 320 based on the working distance WD. The process performed by the control section 510 is described in detail below.

The control section 510 acquires information about the working distance WD from the sample stage drive section 42. The information about the working distance WD corresponds to information about the position of the sample stage 40 in the direction along the optical axis Z, for example. The sample stage drive section 42 may output position information about the sample stage 40, and the control section 510 may acquire the information about the working distance WD from the position information about the sample stage 40.

The control section 510 acquires information about the tilt of the center axis C of the radiation detector 50 with respect to the optical axis Z of the optical system 20 (i.e., information about an optimum tilt) based on the acquired information about the working distance WD. In the example illustrated in FIG. 8, the tilt of the center axis C of the radiation detector 50 with respect to the optical axis Z of the optical system 20 corresponds to the angle $\theta$ formed by the optical axis Z of the optical system 20 and the center axis C of the radiation detector 50. Therefore, the process performed by the control section 510 is described below using the angle $\theta$. The control section 510 acquires information about the angle $\theta$ from a table 522 stored in the storage section 520 corresponding to the working distance WD acquired from the sample stage drive section 42, the table 522 specifying the relationship between the working distance WD and the angle $\theta$ (optimum angle $\theta$), for example.

The control section 510 drives the drive section 320 based on the information about the angle $\theta$ acquired from the table 522. The control section 510 drives the drive section 320 so that the angle $\theta$ formed by the optical axis Z of the optical system 20 and the center axis C of the radiation detector 50 coincides with the angle $\theta$ acquired from the table 522.

The storage section 520 stores the table 522 that specifies the relationship between the working distance WD and the angle $\theta$. The function of the storage section 520 may be implemented by a RAM, an optical disk (CD or DVD), a magneto-optical disk (MO), a magnetic disk, a hard disk, a magnetic tape, a memory (ROM), or the like.

The table 522 specifies the relationship between the working distance WD and the optimum angle $\theta$ that corresponds to each working distance WD, for example. Note that the optimum angle $\theta$ refers to the angle $\theta$ at which X-rays can be most efficiently detected at each working distance WD, for example. Therefore, the control section 510 can acquire information about the optimum angle $\theta$ from the table 522 based on the acquired information about the working distance WD.

The table 522 includes the working distance WD, and the angle $\theta$ that is linked to each working distance WD, for example. The working distance WD can be calculated from the position of the sample stage 40 in the direction along the optical axis Z. Therefore, the table 522 may include the position of the sample stage 40 in the direction along the optical axis Z, and the angle $\theta$ that is linked to each position of the sample stage 40 in the direction along the optical axis Z. The angle $\theta$ can be calculated from the X-ray take-off angle. Therefore, the table 522 may include the working distance WD, and the X-ray take-off angle that is linked to each working distance WD, or may include the position of the sample stage 40 in the direction along the optical axis Z, and the X-ray take-off angle that is linked to each position of the sample stage 40 in the direction along the optical axis Z.

The table 522 is generated in advance based on the design values of the device (i.e., the positional relationship between the X-ray generation point on the sample S and the radiation detector 50), for example. The table 522 may be generated by receiving the information about the intensity of X-rays output from the radiation detector 50, and determining the tilt of the center axis C at which the intensity of X-rays becomes a maximum while changing the tilt of the center axis C of the radiation detector 50 with respect to the optical axis Z of the optical system 20 within a predetermined range at each working distance WD, for example.

The radiation analyzer 500 has the following features, for example.

The radiation analyzer 500 is configured so that the support 60 includes the control section 510 that drives the drive section 320 based on the working distance WD. Therefore, the radiation analyzer 500 can position the radiation detector 50 so that the take-off angle is set such that X-rays can be efficiently detected at an arbitrary working distance WD. For example, the radiation analyzer 500 is configured so that the control section 510 can automatically position the radiation detector 50 so that the X-ray take-off angle is set to be optimum for the working distance WD so as to follow a change in the working distance WD (i.e., the position of the sample stage 40 in the direction along the optical axis Z). Since the radiation analyzer 500 need not determine the tilt of the center axis C at which the intensity of X-rays becomes a maximum, it is possible to position the radiation detector 50 within a short time so that the take-off angle is set such that X-rays can be efficiently detected as compared with the case of driving the drive section 320 based on the detection results of the radiation detector 50 (i.e., radiation analyzer 400), for example.

The radiation analyzer 500 is configured so that the support 60 includes the storage section 520 that stores the table 522 that specifies the relationship between the working distance WD and the tilt of the center axis C of the radiation detector 50 with respect to the optical axis Z of the optical system 20, and the control section 510 acquires the information about the tilt of the center axis C of the radiation detector 50 with respect to the optical axis Z of the optical system 20 from the table 522 corresponding to the working distance WD, and drives the drive section 320 based on the information about the tilt of the center axis C of the radiation detector 50 with respect to the optical axis Z of the optical system 20. Therefore, the radiation analyzer 500 can position the radiation detector 50 so that the take-off angle is set such that X-rays can be efficiently detected at an arbitrary working distance WD.

The invention is not limited to the above embodiments. Various modifications and variations may be made of the above embodiments without departing from the scope of the invention.

Although the above embodiments illustrate an example in which the radiation analyzer (100, 200, 300, 400, or 500) is a scanning electron microscope, the radiation analyzer is not limited to a scanning electron microscope, and the embodiments of the invention can also be applied to various other devices that are provided with an energy-dispersive radiation detector. Examples of such devices include a transmission electron microscope (TEM) that is provided with an energy-dispersive radiation detector, a scanning transmission electron microscope (STEM) that is provided with an energy-dispersive radiation detector, an X-ray microanalyzer (XMA) that is provided with an energy-dispersive radiation detector, and the like.

Although the above embodiments illustrate an example in which electron beams are used as the primary rays, the radiation analyzers according to the embodiments of the invention may utilize X-rays or charged particles (e.g., ions) as the primary rays. Specifically, the radiation analyzers according to the embodiments of the invention may be an X-ray fluorescence spectrometer that is provided with an energy-dispersive radiation detector, and utilizes X-rays as the primary rays, for example.

The invention includes configurations that are substantially the same (e.g., in function, method and effects, or object and effects) as the configurations described in connection with the above embodiments. The invention also includes a configuration in which an unsubstantial element described in connection with the above embodiments is replaced by another element. The invention also includes a configuration having the same effects as those of the configurations described in connection with the above embodiments, or a configuration capable of achieving the same object as those of the configurations described in connection with the above embodiments. The invention further includes a configuration obtained by adding a known technique to the configurations described in connection with the above embodiments.

Although only some embodiments of the invention have been described in detail above, those skilled in the art would readily appreciate that many modifications are possible in the embodiments without materially departing from the novel teachings and advantages of the invention. Accordingly, all such modifications are intended to be included within the scope of the invention.

What is claimed is:

1. A radiation analyzer comprising:
   a primary ray source that generates primary rays;
   an optical system defining an optical axis having an objective lens that applies the primary rays emitted from the primary ray source to a sample;
   an energy-dispersive radiation detector that detects radiation that has been generated from the sample when the primary rays have been applied to the sample; and
   a support that supports the radiation detector so that a tilt of a center axis of the radiation detector with respect to an optical axis of the optical system can be changed to aim the radiation detector at the sample,
   wherein the support includes a rotation section that supports the radiation detector so as to be rotatable around a rotation axis that intersects the optical axis, and
   the center axis is fixed relative to the rotating section and is tilted with respect to the rotation axis.

2. The radiation analyzer as defined in claim 1, further comprising:
   a sample stage that supports the sample so that a working distance being the distance along the optical axis between the objective lens and the sample can be changed.

3. The radiation analyzer as defined in claim 1, further comprising:
   a drive section that drives the rotation section.

4. The radiation analyzer as defined in claim 1,
   wherein the optical system includes an objective lens,
   the radiation detector is set to a second state from a first state using the support,
   a distance between an intersection of the optical axis and the center axis and the objective lens is set to a first distance, and an angle formed by the optical axis and the center axis is set to a first angle when the radiation detector is set to the first state, and
   the distance between the intersection of the optical axis and the center axis and the objective lens is set to a second distance that is shorter than the first distance, and the angle formed by the optical axis and the center axis is set to a second angle that is larger than the first angle when the radiation detector is set to the second state.

5. A radiation analyzer comprising:
   a primary ray source that generates primary rays;
   an optical system defining an optical axis and having an objective lens that applies the primary rays emitted from the primary ray source to a sample;

an energy-dispersive radiation detector that detects radiation that has been generated from the sample when the primary rays have been applied to the sample;

a support that supports the radiation detector so that a tilt of a center axis of the radiation detector with respect to an optical axis of the optical system can be changed to aim the radiation detector at the sample; and a sample stage that supports the sample so that a working distance being the distance along the optical axis between the objective lens and the sample can be changed, wherein the support includes a swing section that supports the radiation detector so as to be swingable to tilt the center axis of the radiation detector with respect to the optical axis such that the center axis intersects the optical axis adjusting the tilt of the center axis of the radiation detector according to a change in the working distance.

6. The radiation analyzer as defined in claim 5, wherein a swing axis of the swing section is orthogonal to the center axis.

7. The radiation analyzer as defined in claim 5, further comprising:

a drive section that drives the swing section.

8. The radiation analyzer as defined in claim 7, wherein the support includes a control section that drives the drive section based on detection results of the radiation detector.

9. The radiation analyzer as defined in claim 7, wherein the support includes a control section that drives the drive section based on the working distance.

10. The radiation analyzer as defined in claim 9, wherein the support includes a storage section that stores a table that specifies a relationship between the working distance and the tilt of the center axis with respect to the optical axis, and the control section acquires information about the tilt of the center axis with respect to the optical axis from the table corresponding to the working distance, and drives the drive section based on the information about the tilt of the center axis with respect to the optical axis.

11. The radiation analyzer as defined in claim 9, wherein the control section acquires information about the working distance from position information about the sample stage.

\* \* \* \* \*